United States Patent
Chu et al.

[11] Patent Number: 6,059,895
[45] Date of Patent: May 9, 2000

[54] STRAINED SI/SIGE LAYERS ON INSULATOR

[75] Inventors: Jack Oon Chu, Astoria; Khalid EzzEldin Ismail, White Plains, both of N.Y.

[73] Assignee: International Business Machines Corporation, Armonk, N.Y.

[21] Appl. No.: 09/311,468

[22] Filed: May 13, 1999

Related U.S. Application Data

[62] Division of application No. 08/846,605, Apr. 30, 1997, Pat. No. 5,906,951.

[51] Int. Cl.[7] .................................................. H01L 29/00
[52] U.S. Cl. ..................... 148/33.1; 148/33.4; 148/33.5; 257/19; 257/190
[58] Field of Search .............................. 438/47, 718, 719, 438/752, 753; 257/12, 15, 18, 19, 20, 21, 22, 24, 183, 184, 187, 190; 148/33, 33.1, 33.4, 33.5

[56] References Cited

U.S. PATENT DOCUMENTS

| | | | |
|---|---|---|---|
| 4,704,785 | 11/1987 | Curran | 438/753 X |
| 5,462,883 | 10/1995 | Dennard et al. | 437/21 |
| 5,534,713 | 7/1996 | Ismail et al. | 257/24 |
| 5,630,905 | 5/1997 | Lynch et al. | 438/753 X |
| 5,659,187 | 8/1997 | Legoues et al. | 257/190 |

*Primary Examiner*—William Powell
*Attorney, Agent, or Firm*—Robert M. Trepp

[57] ABSTRACT

An SOI substrate and method for forming is described incorporating the steps of forming strained layers of Si and/or SiGe on a first substrate, forming a layer of Si and/or $S_iO_2$ over the strained layers, bonding a second substrate having an insulating layer on its upper surface to the top surface above the strained layers, and removing the first substrate. The invention overcomes the problem of forming strained Si and SiGe layers on insulating substrates.

4 Claims, 5 Drawing Sheets

STRAINED SI/SIGE LAYERS ON INSULATOR

This is a divisional of application Ser. No. 08/846,605, filed Apr. 30, 1997 U.S. Pat. No. 5,906,951.

FIELD OF THE INVENTION

This invention relates to Si/SiGe layers on an insulator (SOI) and more particularly to strained Si/SiGe layers on an insulator which are useful for device fabrication such as complementary metal oxide semiconductor (CMOS) transistors, modulation-doped field effect transistors (MODFETs) and heterojunction bipolar transistors (HBTs).

BACKGROUND OF THE INVENTION

Electron mobility in strained Si channels is significantly higher than in bulk Si layers. Measured values at room temperature are about 3,000 cm$^2$/Vs as opposed to 400 cm$^2$/Vs in Si at the same electron density. Similarly, hole mobilities in strained SiGe layers with high Ge content (60% to 80%) have room temperature mobilities that are 5 times larger than in Si (800 cm$^2$/Vs compared to 150 cm$^2$/Vs). The implementation or use of such layers in high speed applications is thus expected to result in higher operating speeds than in state-of-the-art Si devices.

One problem, however, for high speed applications is that of the underlying substrate which may be conducting. GaAs microwave devices benefit from the fact that semi-insulating GaAs substrates are readily available. In Si technology, the normal ways to achieve insulating substrates is by resorting either to Separated by Implanted Oxygen (SIMOX) to form Si on insulator (SOI), Si on sapphire (SOS), or bond and etch back Silicon-On-Insulator (BESOI).

If one would start with any of these substrates in order to grow strained Si layers, one would have to grow a relaxed SiGe buffer first. In order to achieve such a buffer with low dislocation densities, the Ge content in the SiGe has to be graded over a distance that is about 1 μm thick. U.S. Pat. No. 5,659,187 (Ser. No. 08/474,209) filed Jun. 7, 1995 by F. LeGoues et al. describes an incommensurate or relaxed top layer of low defect density single crystal material above a graded layer where the Ge content in SiGe is varied as a function of thickness. The thickness of the graded layer violates the requirement of a thin epitaxial layer on the insulator, which is the main advantage of SOI.

In U.S. Pat. No. 5,534,713 which issued Jul. 9, 1996 to K. E. Ismail and F. Stern and is assigned in part to the assignee herein, a plurality of epitaxial semiconductor layers are grown on a semiconductor substrate. One layer of the plurality of layers is silicon or silicon germanium under tensile strain and one layer is silicon germanium under compressive strain whereby an n channel field effect transistor may be formed with a channel under tension and a p channel field effect transistor may be formed with a channel under compression.

Therefore, there is a need for a technique capable of achieving Si channels under tensile strain, relaxed SiGe layers, and SiGe channels under compressive strain, all standing on an insulating substrate.

SUMMARY OF THE INVENTION

In accordance with the present invention, an SOI substrate and method for forming strained layers on an insulator is described comprising the steps of selecting a first semiconductor substrate, forming a first epitaxial graded layer of $Si_{1-y}Ge_y$ over said semiconductor substrate, forming a second relaxed layer of SiGe over said first graded layer, forming a third p++ doped layer of SiGe, forming a fourth epitaxial strained layer selected from the group consisting of Si and SiGe over said third layer, forming a fifth relaxed layer of $Si_{1-x}Ge_x$, forming a sixth layer of Si, selecting a second substrate having an upper layer of Si or $SiO_2$ thereon, bonding the upper surfaces of the sixth layer and the second substrate together, and removing the first substrate and the first and second layers.

Further, the third layer may also be removed prior to forming FET devices.

Further, one or more additional epitaxial strained layers may be formed. One or more layers may have high hole mobility and one or more layers may have high electron mobility.

The invention further provides forming well implants or implant regions by ion implantation prior to forming the fourth epitaxial strained layer.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
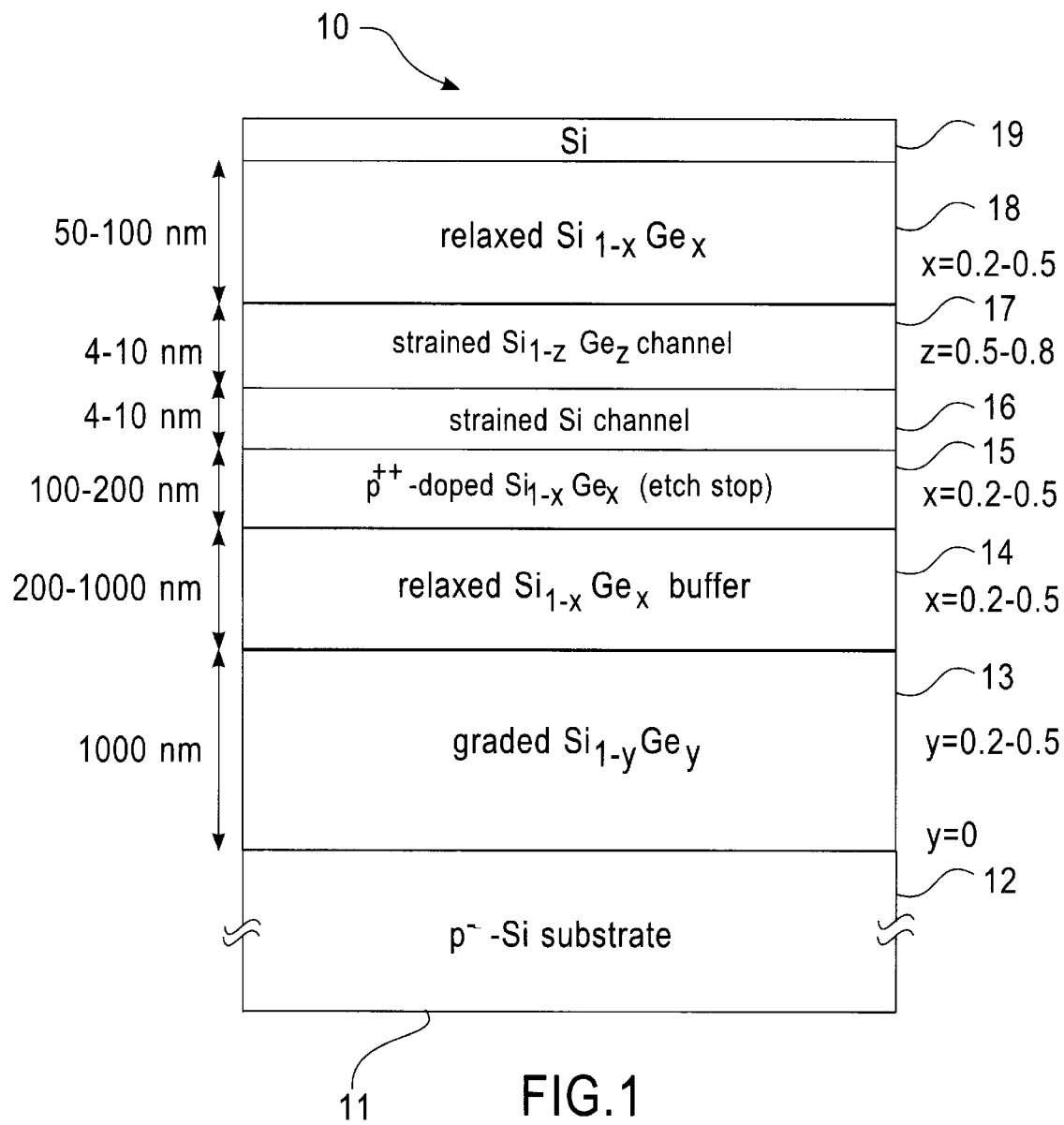
FIG. 1 is a cross section view of a partial embodiment of the invention made with a first sequence of process steps.

Referring to FIG. 1, a partial embodiment 10 of the invention is shown comprising a substrate 12 and a plurality of layers 13–19. Substrate 12 may be a single crystal material suitable for forming epitaxial layers thereon such as Si, SiGe, etc. A first epitaxial graded layer 13 of $Si_{1-y}Ge_y$ is formed on the upper surface of substrate 12. Formation of SiGe layers may be formed according to U.S. Pat. No. 5,298,452 which issued Mar. 29, 1994 to B. S. Meyerson which is incorporated herein by reference. In layer 13 the concentration y of Ge may range from 0 to a value in the range from 0.2 to 0.5. The lattice constant of Ge is about 0.04 larger than the lattice constant of Si. The lattice constant of a SiGe alloy is linear with respect to Ge concentration. Thus where y=0.5, the lattice constant is about 1.02 the lattice constant of Si. Layer 13 may be, for example, 1000 nm thick. A second relaxed epitaxial layer 14 of $Si_{1-x}Ge_x$ is formed over layer 13. Layer 13 may have a thickness in the range from 200 to 1000 nm. The Ge content X in layer 14 is chosen to match the lattice constant of upper surface of layer 13 such that layer 14 is essentially strain free. X may be in the range from 0.2 to 0.5. On top of relaxed layer 14, a third p++ doped layer 15 of the same Ge content X or just slightly higher to compensate for the opposite strain introduced by the dopants, is grown to function as an etch stop layer in subsequent processing. Layer 15 may be doped in the range from $5\times10^{19}$ to $5\times10^{20}$ atoms cm$^3$. The higher the doping the better the selectivity. Layer 15 may have a thickness in the range from 200 to 1000 nm.

A fourth epitaxial strained layer 16 is formed on the upper surface of layer 15. Layer 16 may be selected from the group consisting of Si and SiGe. Additional strained layers of SiGe and Si such as layer 17 may be formed in addition to layer 16. Layers 16 and 17 may have a thickness in the range from 4 to 10 nm. Layer 16 may be Si and layer 17 may be $Si_{1-z}Ge_z$ where Z is in the range from 0.5 to 0.8. Layer 16 may have high mobility to electrons due to strain and layer 17 may have high mobility to holes due to strain.

A fifth epitaxial relaxed layer 18 of $Si_{1-x}Ge_x$ is formed over layer 17. Layer 18 may have a Ge concentration X in the range from 0.2 to 0.5 and a thickness in the range from 50 to 100 nm. A sixth layer 19 of Si is grown over layer 18. Layer 19 has an upper surface 20 which may be partially oxidized to form a SiO$_2$ layer (not shown). For a description of forming strained Si and SiGe layers reference is made to U.S. Pat. No. 5,534,713 supra which is incorporated herein by reference. Layer 19 may be a Si cap layer having a thickness in the range from 5 to 20 nm.

Figure 2:
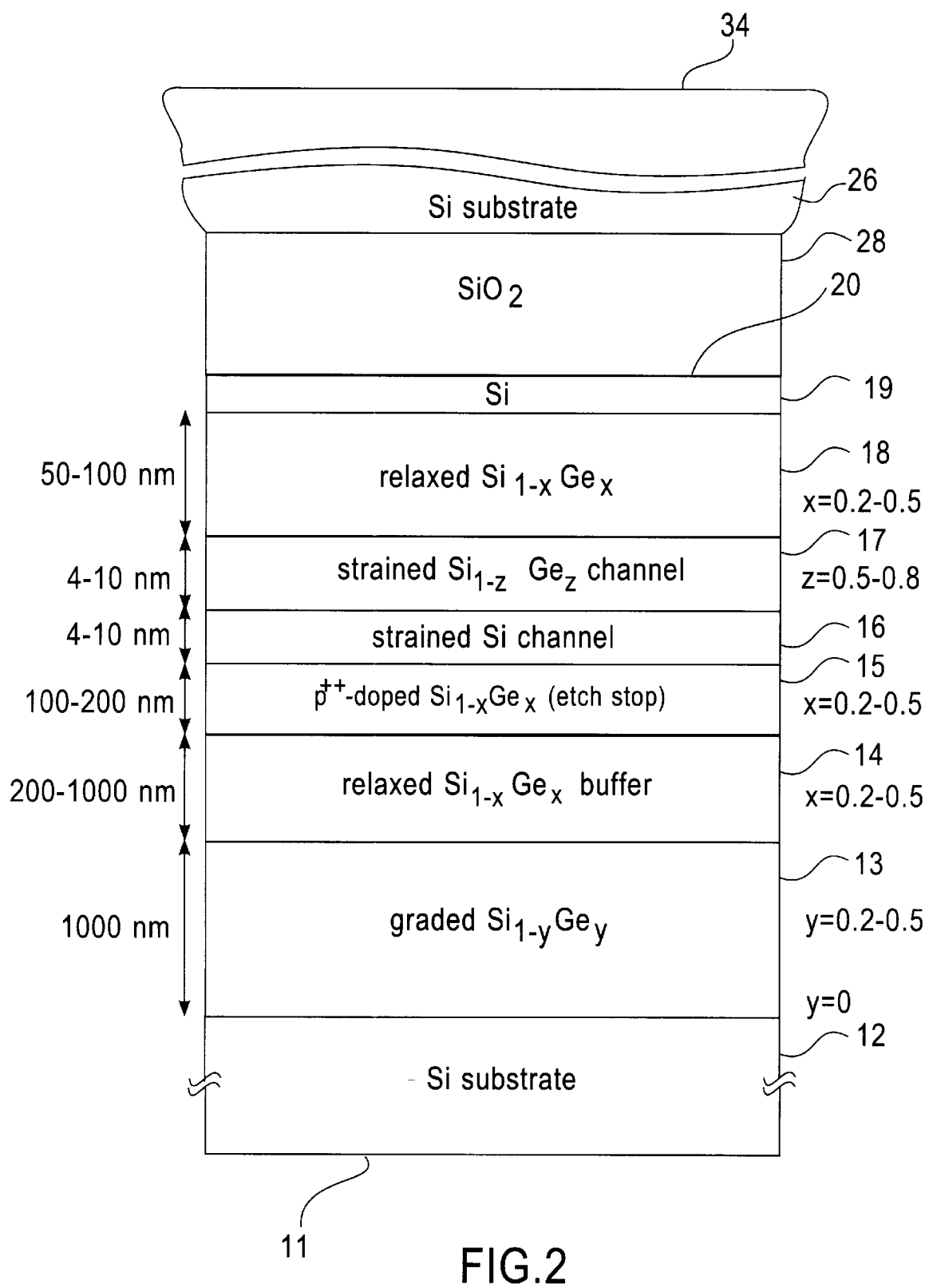
FIG. 2 is a cross section view of a partial embodiment of the invention made with additional process steps with respect to FIG. 1.

A second substrate 26 is selected having an upper layer 28 of SiO$_2$ as shown in FIG. 2. Alternately, layer 28 may be Si. Second substrate 26 may be Si. Second substrate 26 is positioned with upper layer 28 against the upper surface of layer 19 and then bonded together.

Figure 3:
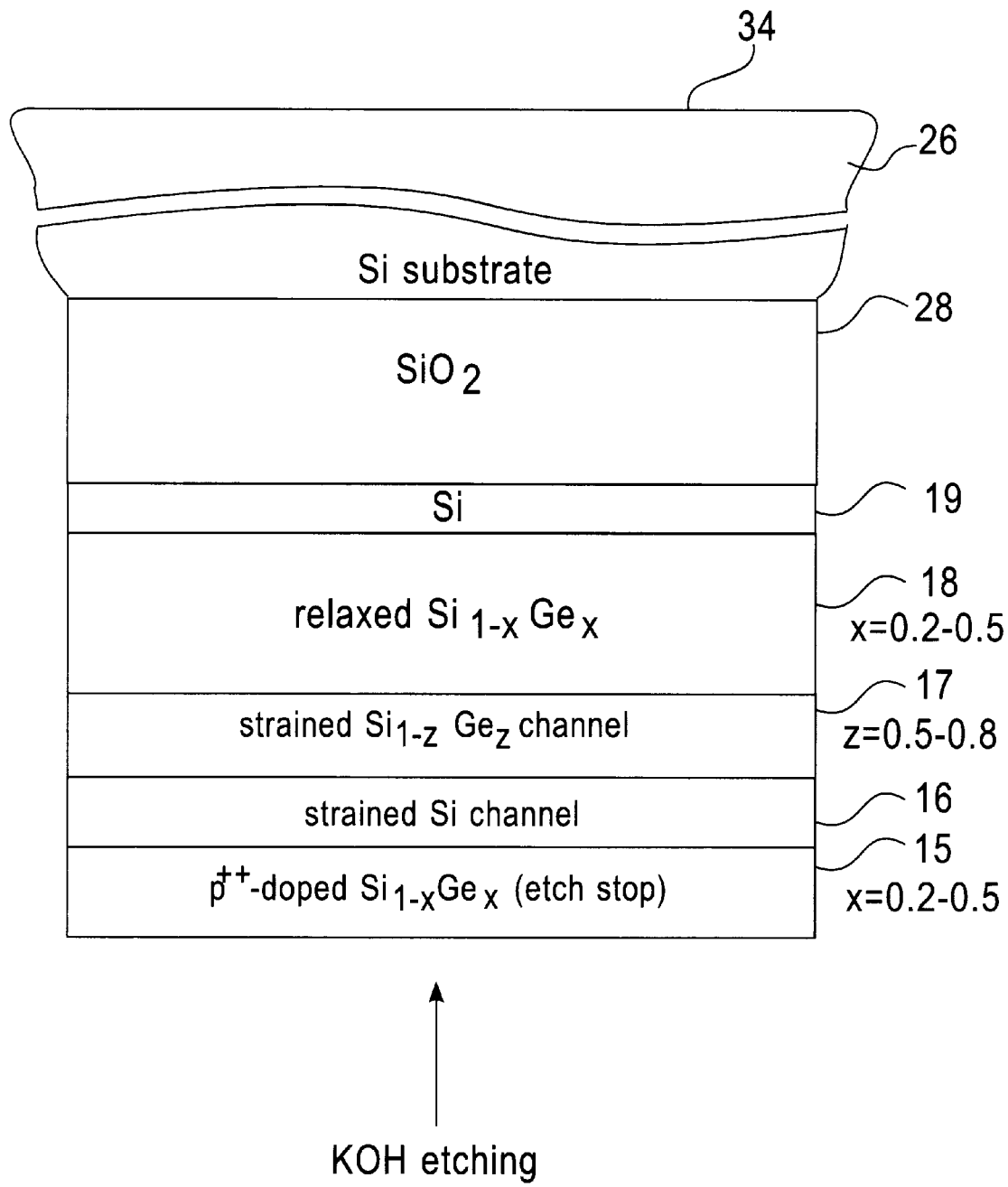
FIG. 3 is a cross section view of a first embodiment of the invention.

Next, second substrate 26 is covered with a protective mask 34 such as white wax as shown in FIG. 2. Then via surface 11, substrate 12, and layers 13 and 14 are etched away, for example, in a hot KOH solution, which stops on heavily doped layer 15 as shown in FIG. 3.

Figure 4:
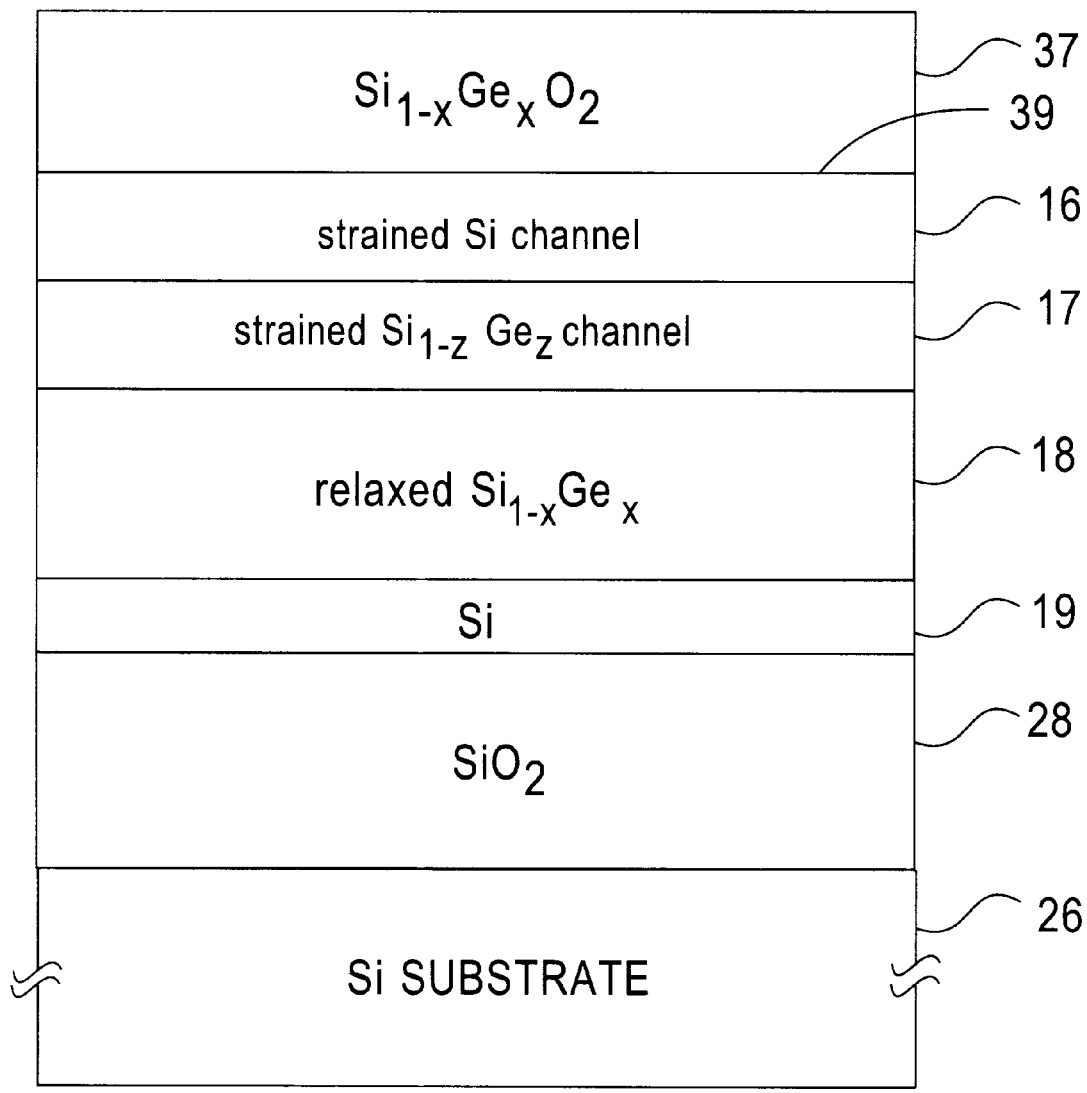
FIG. 4 is a cross section view of a second embodiment of the invention.

Protective mask 34 is then removed. Layer 15 may be kept for device applications such as for vertical junction field effect transistors (JFETs) or heterojunction bipolar transistors (HBTs), or can be removed by oxidation, for example, by oxidizing in wet O$_2$ in the range from 650° C. to 750° C. to form a layer 37 of SiGe oxide, $Si_{1-x}Ge_xO_2$ from SiGe layer 15 as shown in FIG. 4. Layer 37 may then be selectively etched by HF to expose the upper surface 39 of layer 16.

Layer 16 comprises a Si channel under tensile strain with high electron mobility and layer 17 may comprise a SiGe channel under compressive strain with high hole mobility both layers 16 and 17 may be in the range from 50 to 100 nm thick and separated from substrate 26 by insulating layer 28. The structure shown in FIG. 4 without layer 37 should result in the fastest possible performance of field effect transistors.

Figure 5:
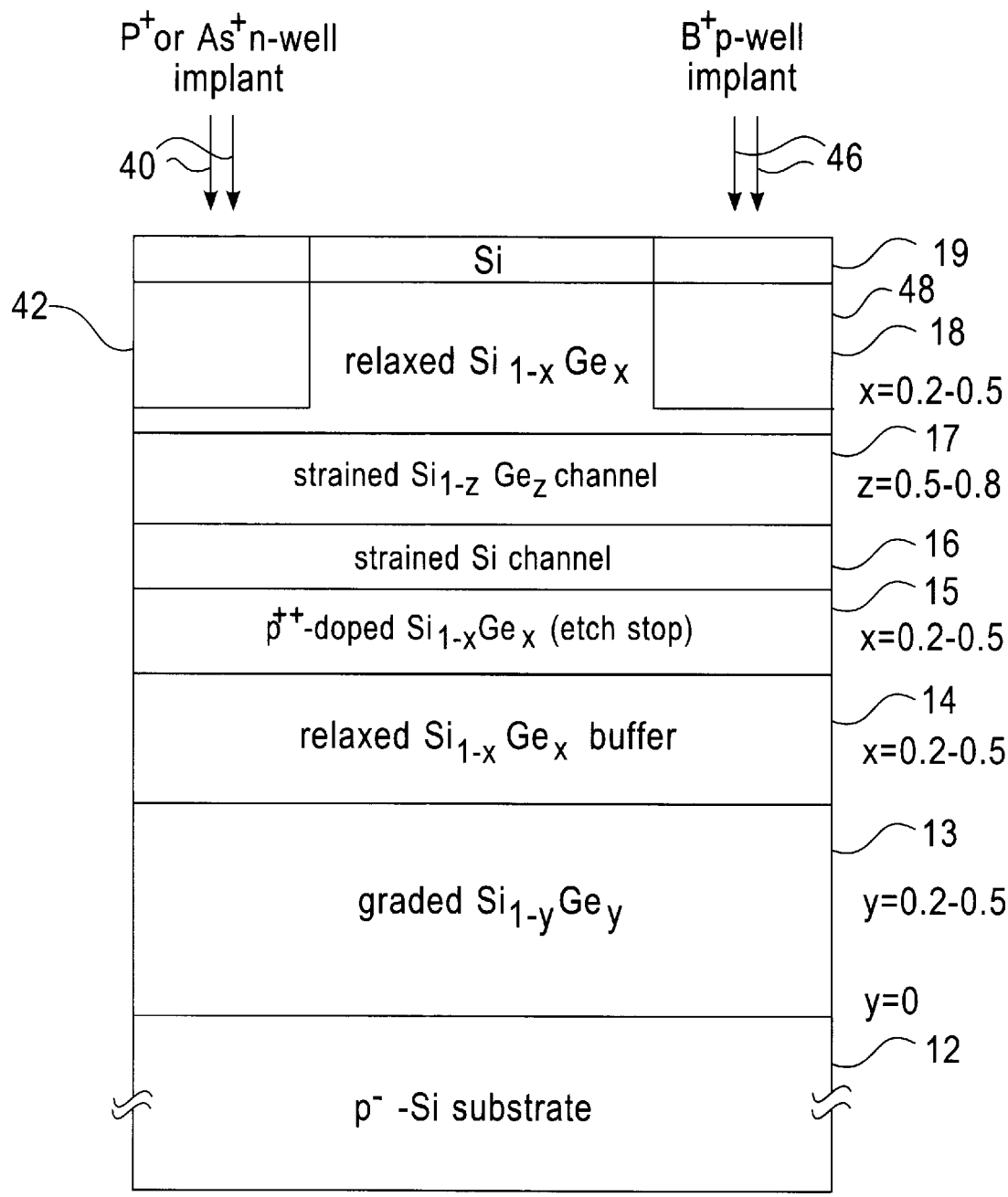
FIG. 5 is a cross section view of a partial embodiment of the invention illustrating a process step to form p or n wells or regions by ion implantation.

Referring to FIG. 5, the partial embodiment shown in FIG. 1 may be further processed prior to the step of selecting a second substrate and bonding it to layer 19 shown in FIG. 2. As shown by arrows 40 in FIG. 5, n dopants may be implanted into layers 19 and 18 to form an n well 42. N dopants may be P+ or As+. Further, as shown by arrows 46 in FIG. 5, p dopants such as B+ may be implanted into layers 19 and 18 to form a p well 48. The advantage of performing ion implantation through layers 19 and 18 is that the penetrating ions do not have to go through the carrier transport channels or layers 16 and 17 as in a typical fabrication process. Thus, the high quality of the channels in terms of carrier mobility is maintained when subsequently formed.

While there has been described and illustrated SOI substrates with strained Si and SiGe layers and a method for forming, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A structure for forming electronic devices comprising:
   a substrate,
   an insulating layer above said substrate,
   a layer of Si bonded to said insulating layer,
   a relaxed layer of $Si_{1-x}Ge_x$ above and epitaxial to said layer of Si where x is in the range from 0.2 to 0.5, and
   a first strained layer above and epitaxial to said relaxed layer selected from the group consisting of Si and SiGe.

2. The structure of claim 1 further including a second strained layer selected from the group consisting of Si and SiGe above said first strained layer.

3. The structure of claim 2 wherein said first strained layer is SiGe and said second strained layer is Si.

4. The structure of claim 2 wherein said first strained layer is Si and said second strained layer is SiGe.

\* \* \* \* \*